(12) United States Patent
Kemppainen et al.

(10) Patent No.: US 6,571,861 B1
(45) Date of Patent: Jun. 3, 2003

(54) ENERGY STORAGE IN COOLING SYSTEMS

(75) Inventors: Ari Kemppainen, Bandhagen (SE); Stefan Holm, Drottningholm (SE)

(73) Assignee: Emerson Energy Systems AB, Stockholm (SE)

( * ) Notice: Subject to any disclaimer, the term of this patent is extended or adjusted under 35 U.S.C. 154(b) by 0 days.

(21) Appl. No.: 09/869,439

(22) PCT Filed: Dec. 30, 1999

(86) PCT No.: PCT/SE99/02505

§ 371 (c)(1), (2), (4) Date: Sep. 28, 2001

(87) PCT Pub. No.: WO00/40915

PCT Pub. Date: Jul. 13, 2000

(30) Foreign Application Priority Data

Dec. 30, 1998 (SE) .............................................. 9804602

(51) Int. Cl.[7] .............................................. F28D 19/00
(52) U.S. Cl. .................... 165/10; 165/104.33; 165/902
(58) Field of Search .............................. 165/10, 104.12, 165/104.33, 104.34, 902; 126/400, 617, 634, 643; 62/434, 59, 393

(56) References Cited

U.S. PATENT DOCUMENTS

| 4,170,261 A | | 10/1979 | Laing et al. | |
|---|---|---|---|---|
| 4,199,021 A | * | 4/1980 | Thoma | 126/400 |
| 4,237,963 A | * | 12/1980 | Girard | 126/400 |
| 4,248,291 A | | 2/1981 | Jarmul | |
| 4,258,696 A | | 3/1981 | Gopal | |
| 4,306,613 A | * | 12/1981 | Christopher | 165/104.33 |
| 4,911,232 A | * | 3/1990 | Colvin et al. | 165/104.17 |
| 5,943,877 A | * | 8/1999 | Chen | 165/10 |
| 6,109,337 A | * | 8/2000 | Gomez | 165/10 |

FOREIGN PATENT DOCUMENTS

| DE | 27 39 068 | 3/1978 |
|---|---|---|
| DE | 43 34 656 A1 | 4/1995 |
| DE | 44 09 500 A1 | 9/1995 |
| GB | 2 040 033 A | 8/1980 |
| SE | 467 173 | 6/1992 |
| WO | WO 96/16485 | 5/1996 |

* cited by examiner

*Primary Examiner*—Henry Bennett
*Assistant Examiner*—Terrell McKinnon
(74) *Attorney, Agent, or Firm*—Harness, Dickey & Pierce, P.L.C.

(57) ABSTRACT

The present invention relates to a method and to an arrangement for storing energy in cooling systems for cooling electronic equipment enclosed in spaces, preferably in insulated spaces. The invention provides an energy storage facility (7) which enables the differences in night-time temperatures and daytime temperatures to be used for cooling purposes, by cooling the energy storage facility (7) with an air flow at low night-time temperatures and by then delivering cold from the energy storage facility to the air flow at higher daytime temperatures, so as to cool the electronic equipment in the closed space (14).

6 Claims, 2 Drawing Sheets

ENERGY STORAGE IN COOLING SYSTEMS

FIELD OF INVENTION

The present invention relates to a method of storing energy in cooling systems intended for cooling electronic equipment enclosed in preferably insulated spaces, and to an arrangement for storing energy in cooling systems used in this field.

DESCRIPTION OF THE BACKGROUND ART

With respect to electronic equipment that is placed outdoors in an insulated space, the purpose of a cooling system is to maintain the internal temperature of the space within a determined temperature range. Even though the ambient temperature may vary from −33 degrees C to +55 degrees C., it is often necessary to maintain the interior temperature of said space within a range of +5 degrees C. to +40 degrees C. with a mean temperature of +25 degrees C. over a long period of time. It is not possible to maintain a temperature beneath +40 degrees C. in a space when the outdoor temperature may be above +40 degrees C., solely by using heat exchangers or ventilation units that include filters. Normally, the higher temperature limit can only be maintained with the aid of an active cooling circuit that includes a compressor. FIG. 1 illustrates how different cooling systems that include ventilation units, heat exchanger units or cooling compressor units can be used for different temperature regions at varying outdoor temperatures.

It is also known to use for cooling purposes small containers that are filled with different sodium sulphate mixtures or paraffins that are able to pass from one phase to another phase such as a solid phase to a liquid phase at given temperatures, so as to deliver heat. These containers can be placed in spaces that house electronic equipment and use as reserve cooling means in the event of a breakdown in the standard cooling system.

SUMMARY OF THE INVENTION

In the event of a variation in the outdoor temperature over a period of one calendar day, such as a temperature difference between day and night, it is possible to store energy passively with the aid of an energy storage facility and use this facility to equalise temperature variations in a space that houses electronic equipment. By storing energy in an equipment cooling system, variations in outdoor temperature can be used conveniently for cooling the equipment. A cooling system that uses a cooled air flow to cool electronic equipment in a closed space may include a heat exchanger that cools the air flow with a passing air flow that arrives directly from outside said space or that has passed through a unit in which said energy is stored. In this regard, energy may be stored in a system of mutually combined plates on which several bodies containing salt solutions are disposed, said plates and bodies being enclosed in a container arranged in the vicinity of the heat exchanger or in the vicinity of some part of said heat exchanger and allowing outdoor air to flow therethrough.

The invention will now be described in more detail with reference to preferred embodiments thereof and also with reference to the accompanying drawings.

DETAILED DESCRIPTION OF PREFERRED EMBODIMENTS

One method of constructing a cooling system with passive energy storage is to place a passive energy storage facility in series with a heat exchanger in the cooling system, where said cooling system delivers a cooling air flow to a space that houses electronic equipment that must be kept cool. In the illustrated case, the air flow cooled in the cooling system is enclosed so as not to mix with the surrounding outdoor air, or ambient air. The passive energy storage facility may have the form of containers filled with a meltable material that will melt at a given temperature while absorbing energy and therewith lower the temperature around the containers. Subsequent to melting of the container contents, it is necessary to recharge the passive energy storage facility, i.e. by cooling to a temperature beneath that at which the meltable material passes to a solid state. Recharging of the passive energy storage facility may require a separate circuit that includes a fan and temperature sensing means.

Figure 1:
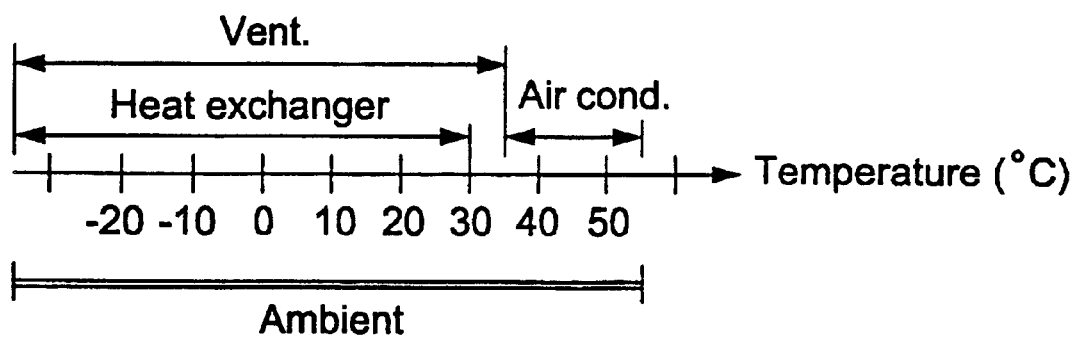
FIG. 1 illustrates a conceivable cooling system for different temperature intervals.
Figure 2:
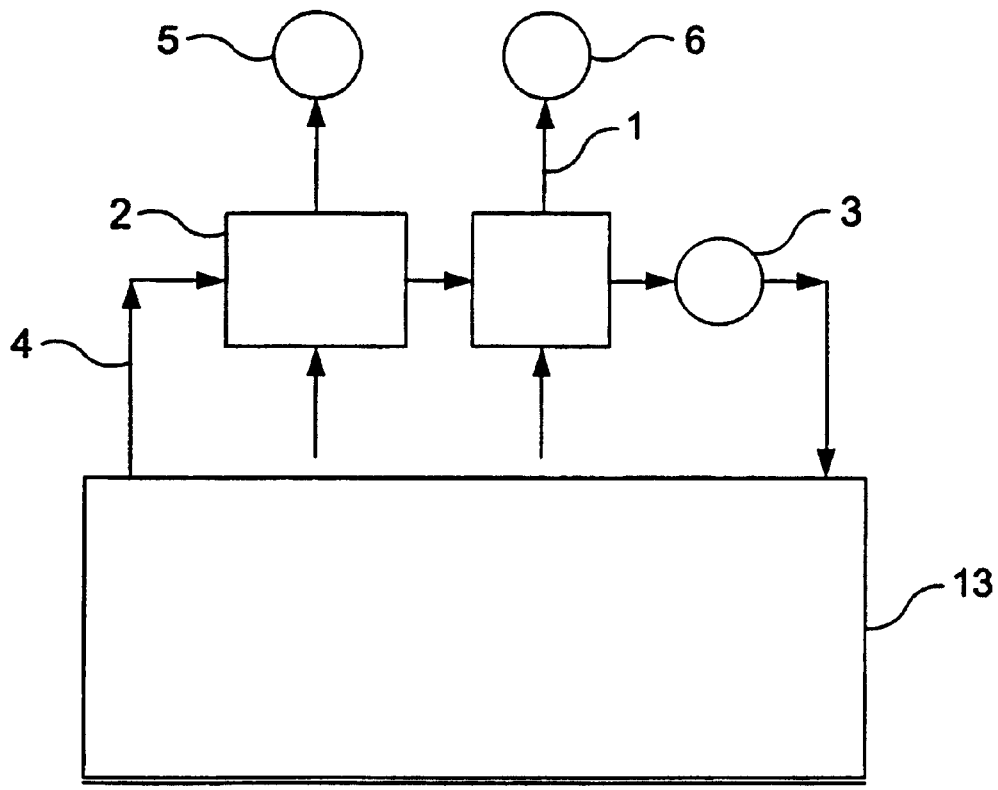
FIG. 2 illustrates a cooling system that includes a passive energy storage facility in accordance with the invention.

FIG. 2 illustrates a passive energy storage facility 1 arranged in series with a heat exchanger 2 and a fan 3 in a cooling circuit 4 for cooling electronic equipment enclosed in a space 13. In the illustrated case, the heat exchanger is supplied with outdoor air for cooling the cooling-circuit air flow, wherewith a fan 5 mounted in the proximity of the heat exchanger causes outdoor air to flow through the heat exchanger so as to cool the cooling-circuit air flow through said heat exchanger. In the case of the illustrated embodiment, the passive energy storage facility 1 has the form of cooling bodies which are disposed in punctiform fashion in a container in several planes and which permit the cooling air to pass through with only a slight resistance to flow, and therewith cool said flow. A fan 6 mounted in the proximity of the passive energy storage facility will ensure that in a recharging process sufficient outdoor air to cool the content of the cooling bodies to a solid state will pass through.

Figure 3:
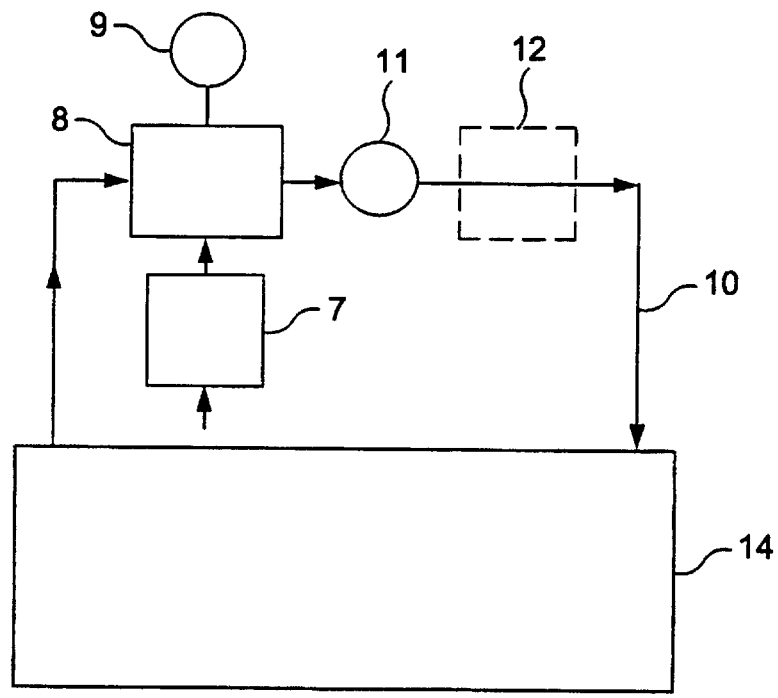
FIG. 3 illustrates a cooling system having alternative positioning of a passive energy storage facility according to the invention.

FIG. 3 illustrates an alternative embodiment of the invention in which the passive energy storage facility 7 has been placed in direct connection with a heat exchanger 8 in series with a fan 9 of a cooling circuit 10 with a cooled air flow. The cooling circuit is closed and is adapted to deliver a cold air stream to a space 14 housing electronic equipment, with the aid of a fan 11. When the passive energy storage facility is placed in direct connection with the heat exchanger or within the heat exchanger, no ventilation passageway, fan and separate means for sensing the temperature of the passive energy storage facility are required. The advantage with this is that when the temperature of the outdoor air becomes too high, the material in the cooling bodies in the passive energy storage facility will melt and therewith absorb energy and lower the temperature of the outdoor air flowing into the heat exchanger. A more stable temperature level of the cooled air flow to the electronic equipment in said space is achieved when the passive energy storage facility is placed in direct connection with the heat exchanger. The passive energy storage facility can be recharged automatically when the outdoor temperature is sufficiently low, wherewith suitable material in the cooling bodies can be adapted to prevailing variations in the outdoor temperature over a calendar day. The lower night temperature is used to cool the cooling bodies in the passive energy storage facility so as to convert the material in said bodies to a solid state, this stored energy being released at elevated daytime temperatures which cause the material to melt. The cooling material can be adapted to a specific use, depending on requirements and prevailing ambient temperatures, so that the cooling requirement of electronic equipment enclosed in a space can be satisfied solely with one passive energy storage facility, by virtue of the energy storage being cooled down at lower night-time temperatures and the stored energy then released for cooling the electronics during the daytime.

With this type of passive energy storage, reserve cooling can be provided in cooling systems that include, e.g., a cooled air flow, by providing a passive energy storage facility 12 in the cooled air flow, said facility 12 either absorbing or delivering energy depending on its composition. The thermal energy taken from the passing air flow as it is cooled is used to melt the material in the cooling bodies. The material in the cooling bodies is caused to solidify by the cold that can be taken from a passing air flow during the night-time, or in some other way.

Figure 4:
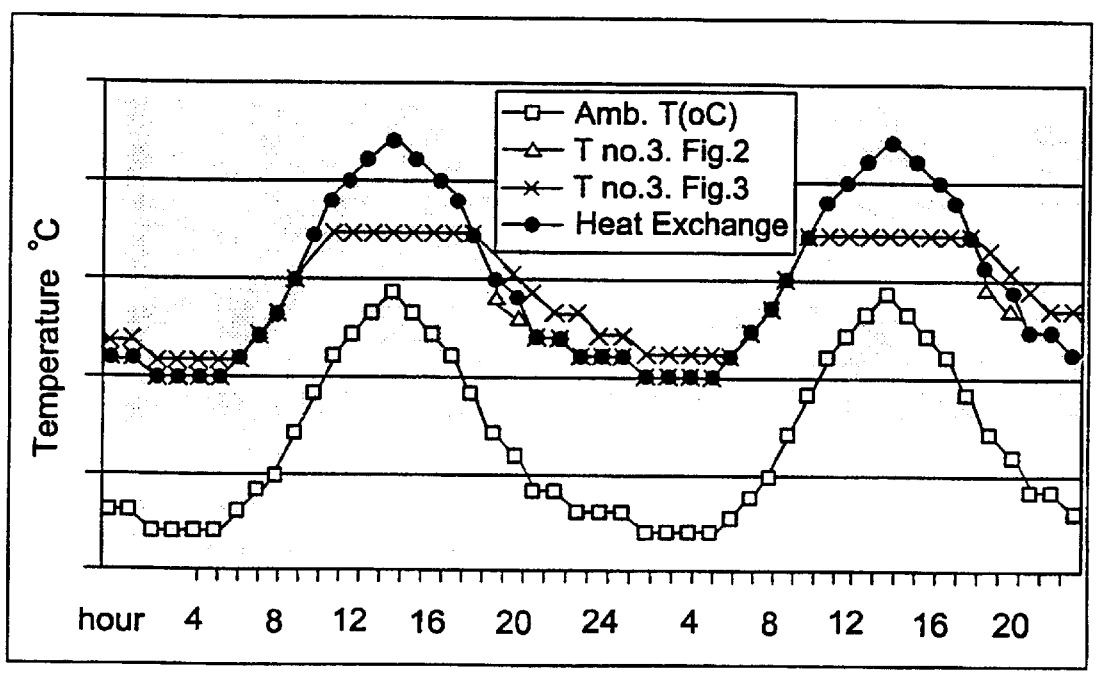
FIG. 4 illustrates the variation of inner temperatures as a function of ambient temperatures.

FIG. 4 shows how the inner temperatures in systems according to FIGS. 2 and 3 can vary as a function of ambient temperature, and shows suitable heat transfer ranges in which night cold can be used to cool the equipment during the daytime.

It will be understood that the invention is not restricted to the aforedescribed and illustrated embodiments thereof, and that modifications can be made within the scope of the following Claims.

What is claimed is:

1. An arrangement for the passive storage of energy in cooling systems that comprise a closed cooling circuit which includes heat exchanger means and fan means for causing a cooled air flow to pass through a space, so as to cool electronic equipment enclosed in said space, characterised in that a passive energy storage facility (7) is arranged to cool an outdoor air flow supplied to the heat exchanger (8), the passive energy storage facility (7) includes one or more cooling bodies disposed in at least one plane and arranged for letting the outdoor air flow to pass through, whereby depending on the temperature of the outdoor air flow and the temperature of the cooling bodies disposed in the passive energy facility (7) the outdoor air flow supplied to the heat exchanger (8) can repeatedly cool or be cooled by the passive energy facility.

2. An arrangement according to claim 1, characterised in that the passive energy storage facility (7) is placed in direct connection with the heat exchanger (8) and with a fan (9).

3. An arrangement according to claim 1, characterised in that the passive energy storage facility is placed in the heat exchanger (8).

4. A method for the passive energy storage in cooling systems that comprise a closed cooling circuit which includes heat exchanging means and fan means for passing a flow of cooled air through a space, so as to cool electronic equipment in said space, characterised in that with a passive energy storage facility energy is taken from an outdoor air flow supplied to the heat exchanger, so as to cool cooling bodies disposed in the energy storage facility with the outdoor air flow, whereby the content of the cooling bodies passes from a liquid state to a solid state, this energy later being used to cool the outdoor air flow supplied to the heat exchanger, for instance when the cooling circuit shall deliver a greater cooling effect during the daytime.

5. A method according to claim 4, characterised by providing said passive energy storage facility in direct connection with the heating exchanger, so that air cooled by the passive energy storage facility can be delivered directly to the heat exchanger by means of a fan.

6. A method according to claim 4, characterised by incorporating the passive energy storage facility in said heat exchanger.

* * * * *